United States Patent [19]

Ditty et al.

[11] Patent Number: 4,746,588
[45] Date of Patent: May 24, 1988

[54] METHOD FOR PREPARING A PHOTOSENSITIVE FILM ON A GLASS SURFACE

[75] Inventors: Lawrence H. Ditty; Victor C. Sledzinski, both of Salem Township, Wayne County, Pa.

[73] Assignee: RCA Corporation, Princeton, N.J.

[21] Appl. No.: 802,021

[22] Filed: Nov. 25, 1985

[51] Int. Cl.$^4$ .......................... G03C 5/00; B05D 5/00
[52] U.S. Cl. .................................. 430/23; 430/935; 430/909; 427/72; 427/73; 427/335; 427/336
[58] Field of Search ................ 430/23, 327, 935, 909; 427/335, 336, 373, 64, 73, 72; 252/321, 358

[56] References Cited

U.S. PATENT DOCUMENTS

| | | | |
|---|---|---|---|
| 2,420,600 | 5/1947 | Kallusky | 252/321 |
| 2,827,392 | 3/1958 | Seats | 427/73 |
| 2,903,377 | 9/1959 | Saulnier | 427/69 |
| 3,558,310 | 1/1971 | Mayaud | 96/36.1 |
| 3,700,444 | 10/1972 | Miller et al. | 430/935 X |
| 3,788,846 | 1/1974 | Mayaud et al. | 96/36.1 |
| 4,049,452 | 9/1977 | Nekut | 96/36.1 |
| 4,255,504 | 3/1981 | Hakala | 430/28 |
| 4,339,524 | 7/1982 | Ichimura et al. | 430/270 |
| 4,369,241 | 1/1983 | Odaka | 430/25 |

*Primary Examiner*—John E. Kittle
*Assistant Examiner*—José G. Dees
*Attorney, Agent, or Firm*—Eugene M. Whitacre; Dennis H. Irlbeck; Vincent J. Coughlin, Jr.

[57] ABSTRACT

A photosensitive film on a glass surface is prepared by: dispensing a quantity of aqueous emulsion containing the film constituents on the surface, distributing the emulsion as a layer over the surface, leveling the distributed layer and then drying the layer. To burst any bubbles that form during distribution, and to remove residual effects of the bubbles, a mist of a surface-tension-reducing liquid, such as methyl alcohol, is contacted with the distributed layer during leveling.

13 Claims, 1 Drawing Sheet

METHOD FOR PREPARING A PHOTOSENSITIVE FILM ON A GLASS SURFACE

This invention relates to a novel method for preparing a photosensitive film on a glass surface. The novel method is particularly useful for preparing a photosensitive film on the inner surface of the glass viewing window of a CRT (cathode-ray tube).

BACKGROUND OF THE INVENTION

A color-television-picture tube, which is a type of CRT, often includes a light-absorbing matrix as a structural part of the luminescent viewing screen in order to increase the contrast of the displayed image. A reverse-printing method for preparing a light-absorbing matrix on the inner surface of the viewing window of a CRT faceplate panel has been described previously, for example in U.S. Pat. Nos. 3,558,310 to E. E. Mayaud and 4,049,452 to E. M. Nekut. In a preferred embodiment of that method, the inner surface of the faceplate of a CRT is coated with a film of a photosensitive material, typically a dichromate-sensitized polyvinyl alcohol. A light image is projected on the film to insolubilize selected regions of the film. The film is flushed with water to remove the still-soluble regions of the film while retaining the insolubilized regions in place. Then, the developed film is overcoated with a layer containing particles of screen structure material, such as graphite. Finally, the retained film regions are removed together with the overlying overcoating, while retaining those portions of the overcoating in the regions previously occupied by removed still-soluble portions of the film. Such retained overcoating portions constitute the matrix of interest.

The photosensitive film is prepared by dispensing a quantity of an aqueous emulsion that contains the ingredients of the film on to inner surface of the window. The panel, which has peripheral sidewalls upstanding from the inner surface, is rotated relatively slowly about a tilted axis through the window, causing the emulsion to slosh over the window surface thereby distributing the emulsion over the surface. Then, the panel is rotated relatively slowly about the axis to level the distributed emulsion, thereafter, the excess emulsion is removed and the leveled emulsion is dried.

While the emulsion is sloshing over the window surface, bubbles frequently form in the emulsion, either by the passage of the emulsion over the window surface or by being bounced off the sidewalls. These bubbles, whether or not they burst, leave variations in the thickness of the film, which appear in the matrix as visible blemishes. By the novel method, any bubbles that form are burst and the emulsion is leveled so that no blemishes related to the bubbles appear in the product.

SUMMARY OF THE INVENTION

The novel method follows the prior procedure described above except that, during the leveling step, the distributed emulsion is contacted with a mist consisting essentially of an organic, surface-tension-reducing liquid for the emulsion. Upon contact, any bubbles that have formed burst, and the emulsion associated with the bubbles is leveled leaving no trace of the bubbles. Preferably, the surface-tension-reducing liquid has a boiling point below that of water, and may be methyl alcohol, for example.

DETAILED DESCRIPTION OF THE PREFERRED EMBODIMENT

Figure 1:
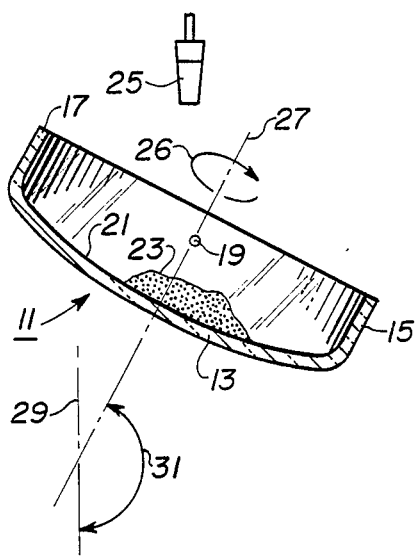
FIGS. 1 through 4 are a series of sectional elevational views of a faceplate panel illustrating the steps, respectively, in a preferred embodiment of the novel method, of dispensing a quantity of emulsion on the inner surface of the window (FIG. 1), distributing the emulsion over the surface (FIG. 2), leveling and contacting a mist with the distributed emulsion (FIG. 3), and removing the excess emulsion from the panel (FIG. 4).

The preferred embodiment is described with respect to coating an inner surface of the viewing window of each of a series of faceplate panels for cathode-ray tubes, particularly for assembly into color television picture tubes. As shown in FIGS. 1 to 4, a faceplate panel 11 comprises a glass viewing window 13 and an integral peripheral sidewall 15 around the window 13. The extended or distal end of the sidewall 15 comprises a sealing land 17. At least three metal studs 19 are sealed into the inner side of the sidewall between the window 13 and the sealing land 17.

In this preferred embodiment, a rectangular 25V-size faceplate panel 11 is held in a work holder (not shown), which rotates and tilts the panel to carry out the method steps on a continuously operating machine. The work holder moves from station to station where the various method steps are carried out with about a 10-second cycle time. As shown in FIG. 1, a metered quantity of emulsion 23 is dispensed from a dispensing nozzle 25 onto the inner window surface 21 of the slowly rotating and tilted panel 11 forming a puddle. The panel 11 rotates as shown by the arrow 26, about a rotation axis 27 that is normal to the plane of the sealing land 17 and passes through the center of the window 13. The rotation axis is tilted from a vertical axis 29 by an angle 31 from the zero-degree axis position in which the sealing land 17 faces down.

The emulsion is the same aqueous emulsion disclosed in the example in U.S Pat. No. 4,049,452, at column 3, and consists essentially of 2.88 weight percent polyvinyl alcohol solids, 1.37 weight percent acrylic copolymer (Rhoplex AC73), 0.317 weight percent sodium dichromate dihydrate, 0.864 weight percent triethylene glycol and the balance water.

Figure 2:
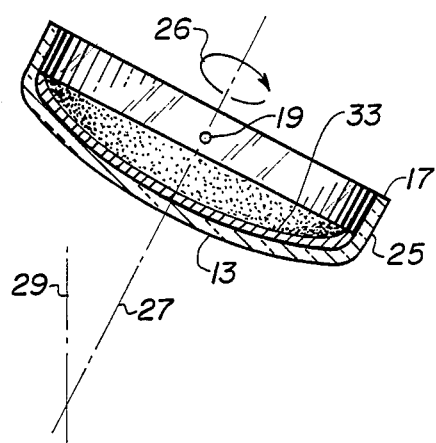

As shown in FIG. 2, the work holder is made to tilt and rotate according to a prescribed program causing the puddle of emulsion to spiral outwardly and bounce inwardly off the sidewall 15 so that the emulsion is distributed as a layer 33 over the entire window surface. In this example, the rotation axis 27 is tilted at an angle of about 150° from the vertical axis 29 and the panel rotates at about 12 rpm. It is during this step that bubbles are apt to form in the emulsion. Bubbles may form for any of several reasons; for example, air may be trapped under the puddle as the puddle moves outwardly, or air bubbles may form as a result of the emulsion bouncing inwardly off the sidewalls 15 of the panel 11. However formed, bubbles concentrate emulsion around their periphery and may remain unburst. Even if the bubbles burst during or after the distribution of the emulsion, they leave traces or vestiges of their presence in the final film, which later appear as blemishes in the product.

Figure 3:
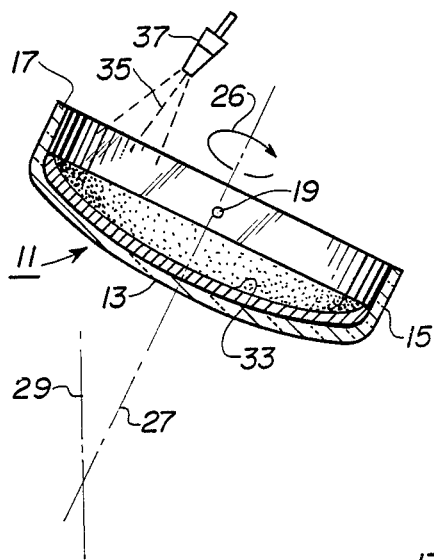

Then, as shown in FIG. 3, the panel 11 continues to rotate about the rotation axis 27 at about 150° and at the same rotation speed of about 12 rpm, whereby the distributed layer of emulsion 33 is leveled, forming an essentially uniform thickness across the window. During this leveling step, a mist 35 of pure methyl alcohol, formed by the misting nozzle 37, is blown into contact with the distributed layer 33, whereby any bubbles present in the emulsion burst and the distributed layer 33 levels rapidly removing all traces of any of the bubbles. It is believed that the alcohol reduces the surface tension on the layer 33 causing the bubbles to burst and speeding the leveling of the layer 33. In addition, since the alcohol has a lower boiling point than water, it is believed that the vapor as well as the mist of alcohol accelerates the effect of the alcohol on the emulsion.

Figure 4:
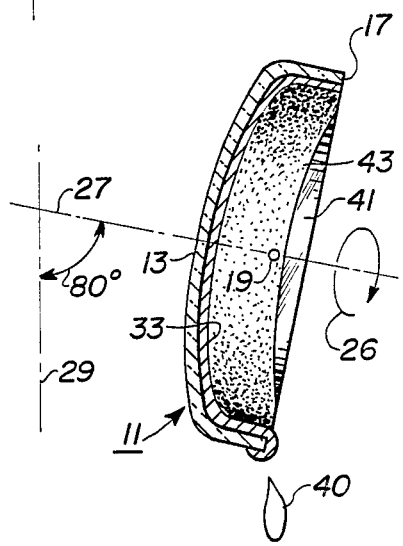

Next, the excess emulsion is removed from the panel 11. As shown in FIG. 4, the panel 11 is rotated rapidly at about 150 rpm with the rotation axis 27 at about 80°. The excess slurry 39 passes over the sidewall 15 and is dumped out of the panel 11. Then, with the rotation axis at about 80° the panel is rotated slowly at about 20 rpm and infrared heat is applied to dry the leveled emulsion, thereby forming a photosensitive film.

SOME GENERAL CONSIDERATIONS

Generally, the details of the novel method are similar to those of the method described in U.S. Pat. No. 4,049,452 to E. M. Nekut, except for the spraying of the mist during the leveling step. Other modifications such as those disclosed in U.S. Pat. Nos. 3,558,310, 3,623,867, 3,652,323, 3,788,846 and 4,255,504 may also be used. Since the method and many variations thereof are already described elsewhere, further descriptions of these details are not necessary.

The mist used during the leveling step may be composed of any liquid which reduces the surface tension of the distributed emulsion. In order to achieve this effect rapidly, the liquid should have a lower boiling point than that of water. Methyl alcohol and ethyl alcohol are preferred misting liquids. Combinations of two or more liquids may be used. Also, water may be added to the misting liquid, although the bubble-bursting effect in the novel method is reduced. Liquids with higher boiling points than water are less effective and also adversely affect the characteristics of the final film.

The mist may be formed by any convenient means. An air spray nozzle operated by compressed air with a venturi suction feed is preferred. In the example, the misting nozzle 37 is a Paasche No. A-CUSAF-0-9 nozzle marketed by Paasche Airbrush Co., Harwood Heights, Ill. 606566.

What is claimed is:

1. In a method for preparing a photosensitive film on a glass surface of a CRT panel including dispensing a quantity of an aqueous emulsion containing the ingredients of said film on said surface, sloshing said quantity of emulsion to distribute said emulsion over said surface, whereby said emulsion is prone to form bubbles therein, leveling said distributed emulsion on said surface, and then drying said leveled emulsion, the additional step of contacting said distributed emulsion with a mist consisting essentially of an organic, surface-tension-reducing liquid during said leveling step, so as to burst bubbles that have formed and to level accumulations of emulsion formed by said bubbles.

2. The method defined in claim 1 wherein said surface-tension-reducing liquid has a boiling point below that of water.

3. The method defined in claim 1 wherein said surface-tension-reducing liquid consists essentially of an alcohol selected from the group consisting of methyl alcohol and ethyl alcohol.

4. The method defined in claim 3 wherein said liquid is methyl alcohol.

5. The method defined in claim 1 wherein said emulsion is distributed by tilting and rotating said glass surface.

6. The method defined in claim 5 wherein said mist is formed with an air spray nozzle directed at said distributed emulsion.

7. A method for preparing a photosensitive film on the inner surface of a glass CRT panel, said panel having a central rectangular viewing window and peripheral sidewalls around said inner surface, including dispensing a quantity of an aqueous emulsion containing a sensitizable binder and a sensitizer for said binder on said inner surface, sloshing said quantity of emulsion across said inner surface to distribute said emulsion over said surface, whereby said emulsion bounces off said sidewalls and is prone to form bubbles therein; leveling said distributed emulsion on said inner surface; during said leveling step, spraying a mist consisting essentially of an organic, surface-tension-reducing liquid into contact with said distributed emulsion, thereby causing said bubbles to burst and leveling uneven accumulations of emulsion formed by said bubbles; and then drying said leveled emulsion.

8. The method defined in claim 7 wherein said emulsion is distributed by relatively slow rotation of said panel about a tilted axis through the center of said panel.

9. The method defined in claim 8 wherein said distributed emulsion is leveled by relatively slow rotation of said panel about said tilted axis.

10. The method defined in claim 9 wherein said binder is polyvinyl alcohol and said sensitizer is a dichromate sensitizer.

11. The method defined in claim 10 wherein said surface-tension-reducing liquid is an alcohol having a boiling point below the boiling point of water.

12. The method defined in claim 11 wherein said alcohol is methyl alcohol.

13. The method defined in claim 11 wherein said alcohol is ethyl alcohol.

* * * * *